(12) United States Patent
Kojima

(10) Patent No.: US 6,505,315 B1
(45) Date of Patent: Jan. 7, 2003

(54) SEMICONDUCTOR DEVICE TESTING APPARATUS AND SIGNAL OUTPUT APPARATUS FOR OUTPUTTING A DIFFERENTIAL SIGNAL TO A TEST SEMICONDUCTOR DEVICE

(75) Inventor: Shoji Kojima, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/338,606

(22) Filed: Jun. 23, 1999

(30) Foreign Application Priority Data

Jun. 23, 1998 (JP) ............................................ 10-176460

(51) Int. Cl.[7] .............................................. G01R 31/28
(52) U.S. Cl. ........................................ 714/724; 714/712
(58) Field of Search ........................ 375/257; 714/743, 714/738, 739, 724, 712; 326/83; 327/108

(56) References Cited

U.S. PATENT DOCUMENTS

| | | | | |
|---|---|---|---|---|
| 5,287,386 A | * | 2/1994 | Wade et al. | 375/257 |
| 5,321,700 A | * | 6/1994 | Brown et al. | 714/743 |
| 5,767,698 A | * | 6/1998 | Emeigh et al. | 326/83 |
| 5,854,797 A | * | 12/1998 | Schwartz et al. | 714/724 |
| 5,942,922 A | * | 8/1999 | Dinteman et al. | 327/108 |

* cited by examiner

Primary Examiner—David Ton
(74) Attorney, Agent, or Firm—Rosenthal & Osha L.L.P.

(57) ABSTRACT

A signal output apparatus includes a selection circuit which receives a first signal and a second signal and selects and outputs an inverted signal of the first signal or the second signal as an inverted first signal. The signal output apparatus includes a first driver for outputting the first signal; and a second driver for outputting the inverted first signal or said second signal selected by the selection circuit; and an output signal detection unit for detecting a semiconductor device output signal generated by a semiconductor device based on the signals output from the first driver and second driver.

14 Claims, 5 Drawing Sheets

SEMICONDUCTOR DEVICE TESTING APPARATUS AND SIGNAL OUTPUT APPARATUS FOR OUTPUTTING A DIFFERENTIAL SIGNAL TO A TEST SEMICONDUCTOR DEVICE

This patent application claims priority based on a Japanese patent application, H10-176460 filed on Jun. 23, 1998 the contents of which are incorporated herein by reference.

BACKGROUND OF THE INVENTION

1. Field of the Invention

The present invention relates to a signal output apparatus capable of outputting a differential signal, and more particularly to a signal output apparatus which outputs a differential signal in a semiconductor device testing apparatus to a test semiconductor device.

2. Description of Related Art

FIG. 1 shows a conventional semiconductor device testing apparatus which generates a differential signal in a semiconductor device using two signal output units. The semiconductor device testing apparatus has a formatter 20 and a differential output circuit 30. The formatter 20 has multiple formatter elements. The differential output circuit 30 has multiple differential output circuit elements. The formatter element 20a and the differential output circuit element 34a constitute the first signal output Unit. The differential output circuit element 34a has a pin driver 80a, and switches 82a and 84a. The formatter element 20b and the differential output circuit element 34b constitute the second signal output unit. The differential output circuit element 34b has a pin driver 80b, and switches 82b and 84b. As shown in the drawing, the first signal output unit and the second signal output unit are identically structured.

The semiconductor device testing apparatus is separated into a testing apparatus main body which generates a semiconductor device input signal to be input to the test semiconductor device and a test head for loading and testing the test semiconductor device. In the conventional apparatus for generating a differential signal shown in FIG. 1, the formatter 20 is contained in the testing apparatus main body and the differential output circuit 30 is contained in the test head. The cables 60a and 60b connect the testing apparatus main body with the test head.

The formatter element 20a re-shapes the signal waveform of the semiconductor device input signal 12a so as to input the semiconductor device input signal 12a to the test semiconductor device. The formatter element 20b re-shapes the signal waveform of the semiconductor device input signal 12b to input the semiconductor device input signal 12b to the test semiconductor device. The waveform re-shaped semiconductor device input signal 22a as a differential signal is then input to the pin driver 80a. The waveform reshaped semiconductor device input signal 22b as a differential signal is then input to the pin driver 80b. The pin driver 80a outputs the first signal 32a and the pin driver 80b outputs the second signal 32b. The second signal 32b has an inverted pattern of the first signal 32a.

The switches 82a and 84a are selectively opened and closed. The switches 82b and 84b are also selectively opened and closed. When the switches 82a and 82b are closed, the first signal 32a and the second signal 32b are transmitted to the test semiconductor device. When the switches 84a and 84b are closed, the earth electric potential is supplied to the test semiconductor device.

In the conventional semiconductor device testing apparatus, in testing the differential signal pin set, a differential signal is generated using the first signal 32a and the second signal 32b, which are two independent signals.

When differential signals are generated using the conventional semiconductor device testing apparatus shown in FIG. 1, the skew between the differential signals becomes large. That is, the first signal output unit and the second signal output unit output the first signal 32a and the second signal 32b, respectively, independently of each other. Therefore, the skew between the differential signal made by the first signal and the differential signal made by the second signal 32b contains at least the skew between the signals generated by the formatters 20a and 20b and the skew between the signals generated by the pin drivers 80a and 80b.

This skew between the differential signals causes an operation error in the semiconductor device being tested. The skew between the differential signals input to the test semiconductor device hence must be reduced as much as possible.

To solve the problem stated above, the present invention provides a semiconductor device testing apparatus for testing a semiconductor device having a differential signal input pin set to which a differential signal is input. This semiconductor device testing apparatus has a pattern generator for generating a semiconductor device input signal for testing the semiconductor device, a differential signal separation driver which receives the semiconductor device input signal and outputs the semiconductor device input signal as a differential signal to the differential signal input pin set through two separate transmission lines, a semiconductor device plug-in unit, to which the semiconductor device is plugged in, for supplying the differential signal output from the differential signal separation driver to the semiconductor device, and an output signal detection unit which detects an output signal that is generated based on the differential signal supplied to the semiconductor device by the semiconductor device plug-in unit.

The differential signal separation driver may be installed for each differential signal input pin set of the semiconductor device. The semiconductor device testing apparatus may further have a formatter for re-shaping the waveform of the semiconductor device input signal generated by the pattern generator. The semiconductor device input signal input to the differential signal separation driver may be a differential signal.

The present invention also provides a signal output apparatus having a selection circuit which receives a first signal and a second signal and selects and outputs the inverted first signal as an invert signal of the first signal or the second signal, a first driver for outputting the first signal, and a second driver for outputting the inverted first signal or the second signal selected by the selection circuit.

The signal output apparatus may further have a first formatter for generating the first signal and a second formatter for generating the second signal. The signal output apparatus may further have a time delay circuit for delaying the first signal.

The time delay circuit may delay transmission of the first signal by a length of time substantially equal to the length of time the inverted first signal and the second signal require to pass through the selection circuit. The first formatter may re-shape the waveform of the first signal in generating the first signal and the second formatter may re-shape the waveform of the second signal in generating the second signal.

Moreover, the present invention provides a semiconductor device testing apparatus for testing a semiconductor device having a differential signal input pin set to which a differential signal is input, having a pattern generator for generating a semiconductor device input signal for testing the semiconductor device, a signal output circuit which outputs the semiconductor device input signal generated by the pattern generator to the semiconductor device, a semiconductor device plug-in unit, to which the semiconductor device is plugged in, for supplying the semiconductor device signal output from the signal output circuit to the semiconductor device, and an output signal detection unit which detects an output signal that is generated based on the semiconductor device input signal supplied to the semiconductor device by the semiconductor device plug-in unit. In this case, the signal output circuit has a selection circuit which receives a first signal and a second signal and selects and outputs the inverted first signal as an invert signal of the first signal or the second signal, a first driver for outputting the first signal, and a second driver for outputting the inverted first signal or the second signal selected by the selection circuit.

In one aspect of the present invention, the signal output circuit may further have a first formatter for generating the first signal and a second formatter for generating the second signal. The signal output circuit may further have a time delay circuit for delaying the first signal.

The time delay circuit may delay transmission of the first signal by the length of time substantially equal to the length of time the inverted first signal and the second signal require to pass through the selection circuit. The first formatter may re-shape the waveform of the first signal in generating the first signal and the second formatter re-shapes the waveform-of the second signal in generating the second signal.

DETAILED DESCRIPTION OF THE INVENTION

Analog ICs are widely used in TVs, radios, and audio apparatuses so as to amplify, detect, modulate, and emit analog signals. The voltage of an analog IC needs to be strictly controlled so as to process analog signals. Therefore, differential type analog ICs which operate using the difference of two input signals are often used. Moreover, in digital ICs as well, some of them use a differential input to meet a high speed operation requirement.

Figure 2:
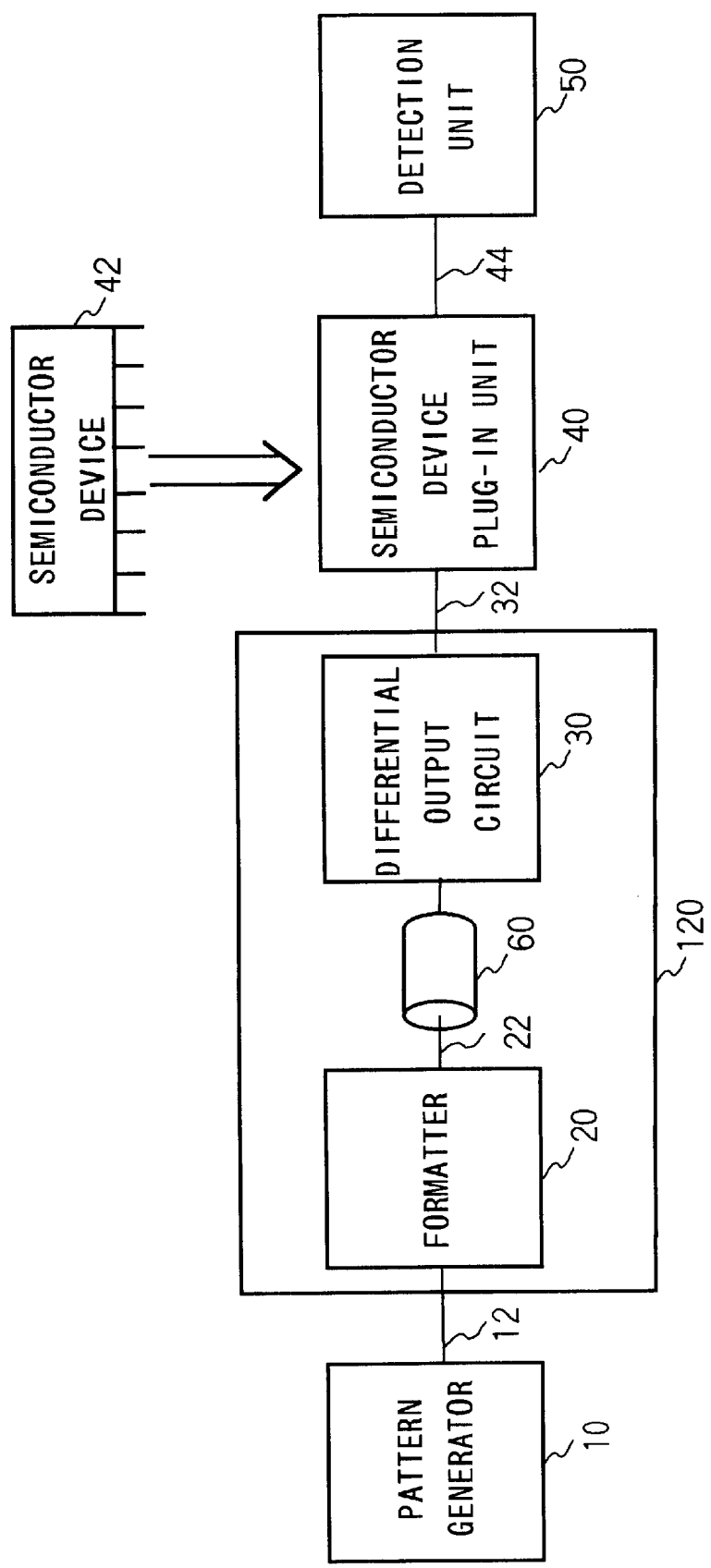
FIG. 2 shows a semiconductor device, testing apparatus according to the first embodiment of the present embodiment.

FIG. 2 shows a semiconductor device testing apparatus according to the first embodiment of the present embodiment, which tests a semiconductor device 42. This semiconductor device testing apparatus has a pattern generator 10, a signal output circuit 120, a semiconductor device plug-in unit 40, and a detection unit 50. The signal output circuit 120 has a formatter 20 and a differential output circuit 30. The semiconductor device testing apparatus has a testing apparatus main body for generating a semiconductor device input signal to be supplied to the semiconductor device 42 and a test head for loading the semiconductor device 42. In this embodiment, the pattern generator 10 and the formatter 20 are contained in the testing apparatus main body, and the semiconductor device plug-in unit 40 and the detection unit 50 are contained in the test head. The testing apparatus main body and the test head are contained in separate units that are connected to each other with a cable 60. The formatter 20 is contained in the testing apparatus main body. However in another embodiment, the formatter 20 may be contained in the test head.

The pattern generator 10 generates a semiconductor device input signal 12 for testing the semiconductor device 42. The semiconductor device input signal 12 is input to the formatter 20. The waveform of the semiconductor device input signal 12 is re-shaped in response to the characteristic of the semiconductor device 42. After this, the waveform re-shaped semiconductor device input signal 22 is then input to the differential output circuit 30 via the cable 60. The length of this cable 60 is several meters. The differential output circuit 30 outputs the semiconductor device input signal 22 as a differential signal 32 to the semiconductor device plug-in unit 40.

The semiconductor device 42 is plugged into the semiconductor device plug-in unit 40. The semiconductor device 42 then receives the differential signal 32 as an input signal from the semiconductor device plug-in unit 40. The semiconductor device 42 outputs the output signal 44 to the detection unit 50 via the semiconductor device plug-in unit 40 based on the input differential signal 32. The detection unit 50 receives the output signal 44 and judges whether the semiconductor device is acceptable or not.

The electric devices that constitute the semiconductor device testing apparatus operate with a differential signal so as to stabilize the circuit operation. Therefore, in an actual semiconductor device testing apparatus, most signals are transmitted as differential signals. Hence, in most cases, the signals transmitted in FIG. 2 are actually transmitted as differential signals via two transmission lines.

Figure 1:
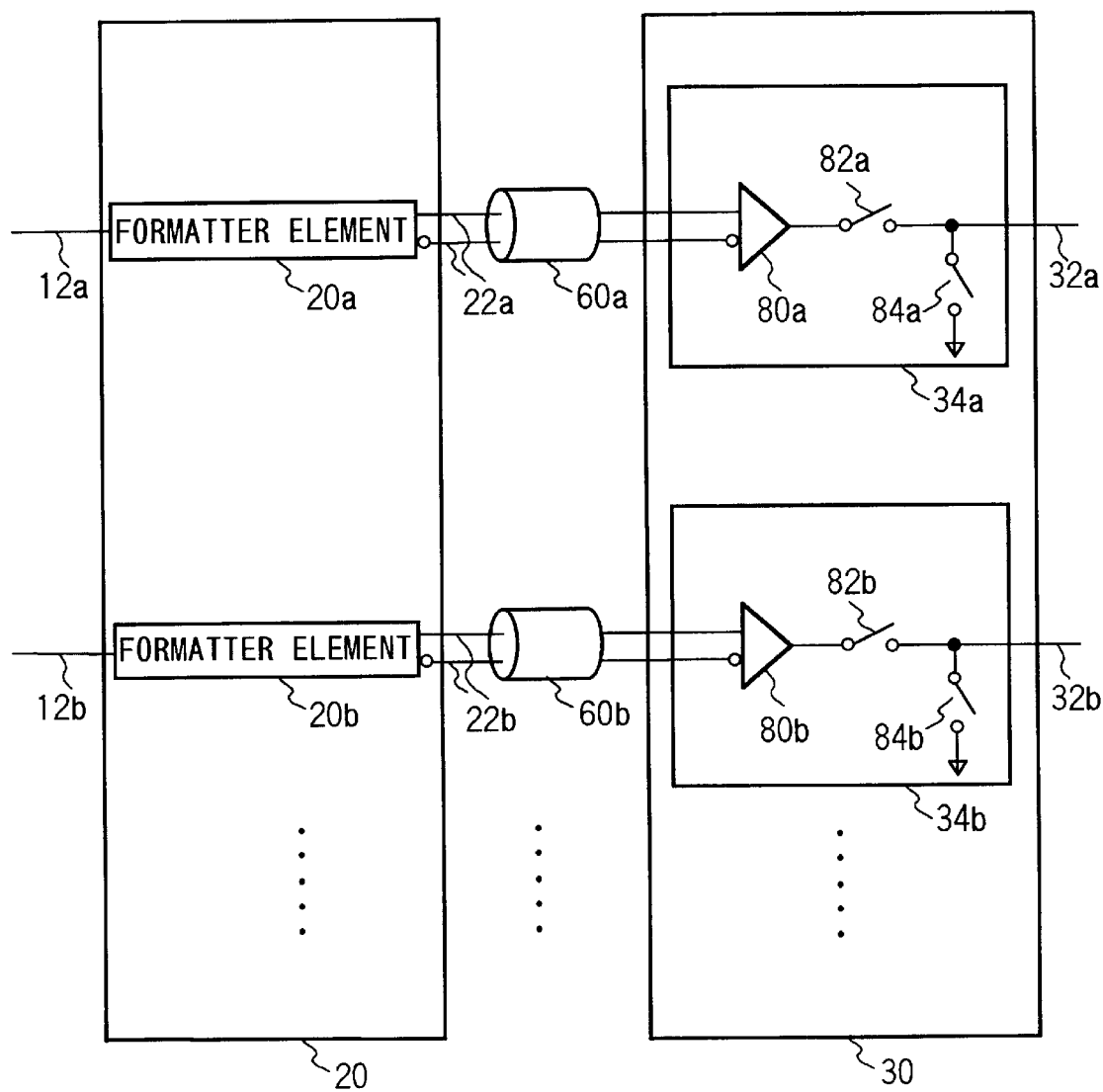
FIG. 1 shows a conventional semiconductor device testing apparatus which outputs differential signals using two signal output units.
Figure 3:
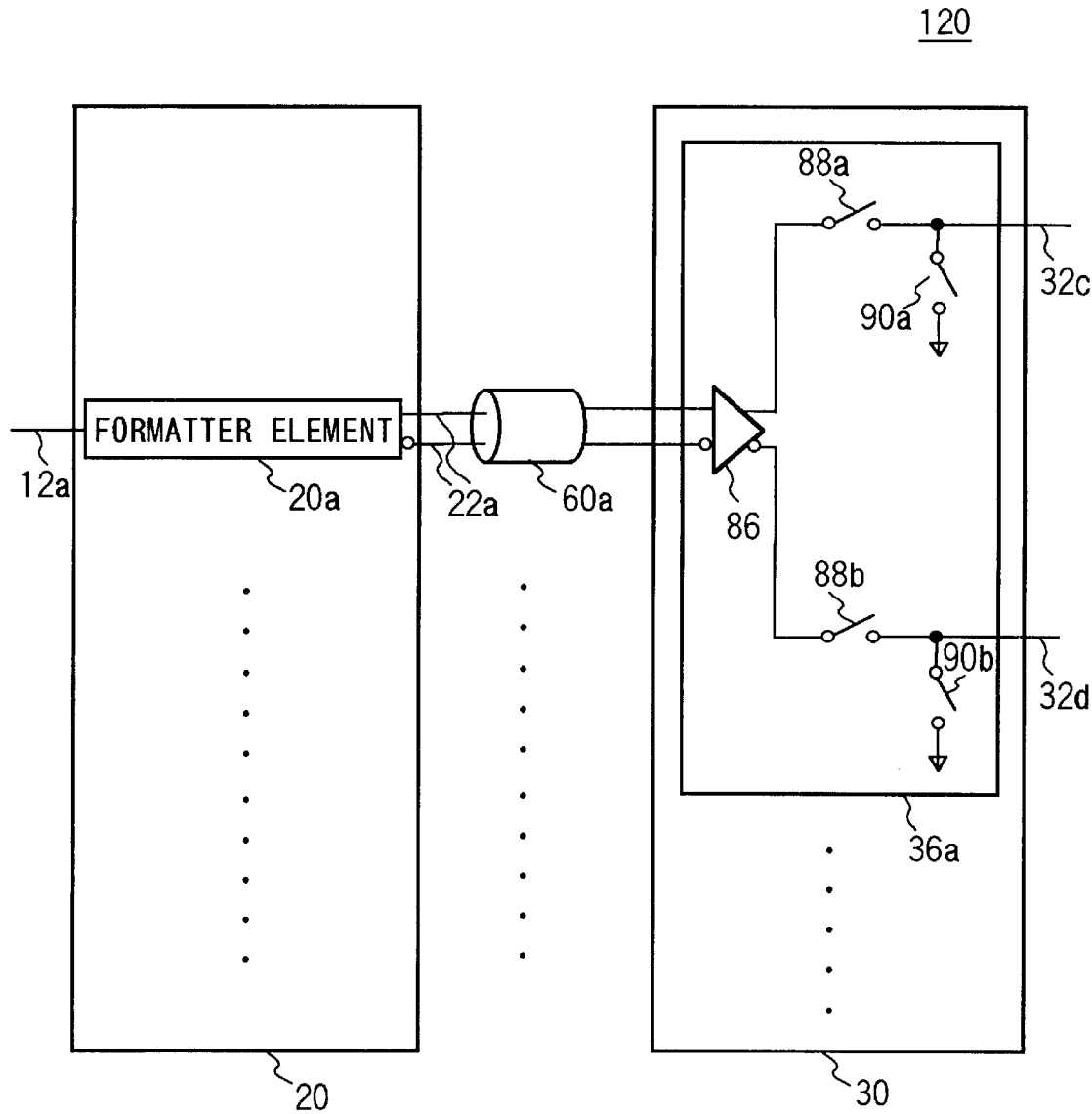
FIG. 3 shows in detail the configuration of the signal output circuit 120 shown in FIG. 2 which outputs a differential signal according to the first embodiment of the present invention.

FIG. 3 shows in detail the configuration of the signal output circuit 20 shown in FIG. 2 according to the first embodiment. In the fist embodiment, the formatter 20 has a formatter element 20a, and the differential output circuit 30 has a differential output circuit element 36a. This signal output circuit 120 differs from the conventional one shown in FIG. 1 in that it can output a differential signal using just one formatter element 20a. In FIG. 3, only one formatter element 20a and only one differential output circuit element 36a are shown. However, the formatter 20 may have multiple formatter elements, and the differential output circuit 30 may have multiple differential output circuit elements 36a. The differential output circuit element 36a has a differential signal separation driver 86, and switches 88a, 90a, 88b, and 90b.

The switch 88a is connected to one output terminal of the differential signal separation driver 86, and the switch 88b is connected to the other output terminal of the differential signal separation driver 86. The switches 90a and 90b are grounded. The formatter element 20a and the differential output circuit element 36a are connected to each other with a cable 60a. When the semiconductor device 42 has multiple differential signal input pin sets, the formatter element 20a and the differential output circuit element 36a are installed for each of the multiple differential signal input pin sets. In the present document, the differential signal input pin set refers to a pair of differential signal pins that receive a differential input.

The method by which the signal output circuit shown in FIG. 3 outputs the differential signal will be explained. First, the semiconductor device input signal 12a is input to the formatter element 20a. The semiconductor device input signal 12a may be transmitted through one transmission line or as a differential signal through two transmission lines. The formatter element 20a re-shapes the waveform of the semiconductor device input signal 12a in response to the characteristic of the test semiconductor device 42, and outputs the waveform re-shaped semiconductor device input signal 22a. In FIG. 3, the semiconductor device input signal 22a is transmitted as a differential signal through two transmission lines. However, it may be transmitted through one transmission line.

The semiconductor device input signal 22a is input to the differential signal separation driver 86 via the cable 60a. The differential signal separation driver 86 separates the input semiconductor device input signal 22a into a non-inverted signal 32c and an inverted signal 32d, and outputs them through two transmission lines.

The switches 88a and 90a are selectively opened and closed. This selection is based on whether the differential signal output pin of the semiconductor device 42 requires the non-inverted signal 32c to be input or grounded. When the switch 88a is closed and the switch 90a is opened, the non-inverted signal 32c is input to the differential signal input pin of the semiconductor device 42. On the other hand, when the switch 88a is opened and the switch 90a is closed, the ground electric potential is input to the differential signal input pin of the semiconductor device 42. Similarly, switches 88b and 90b are also selectively opened and closed. In order to supply the non-inverted signal 32c and inverted signal 32d to the semiconductor device 42, the switches 88a and 88b are closed and the switches 90a and 90b are opened.

The non-inverted signal 32c and the inverted signal 32d can be output as differential signals to the semiconductor device 42. In the differential output circuit element 36a of the first embodiment the differential signal separation driver 86 outputs the differential signals 32c and 32d. Therefore, the skew between the differential signals 32c and 32d is much smaller than the skew between the differential signals 32a and 32b that are output by the conventional one shown in FIG. 1.

Figure 4:
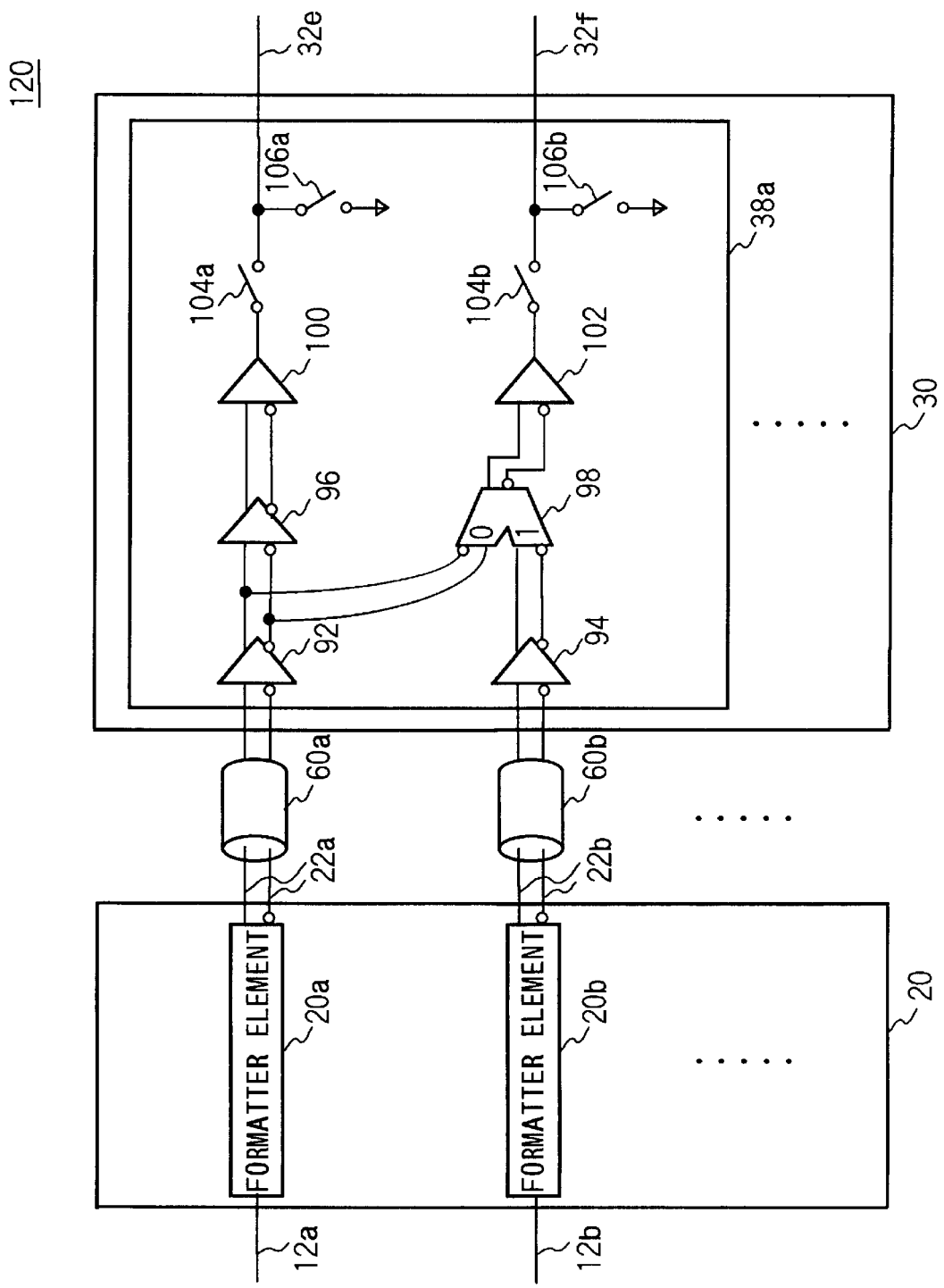
FIG. 4 shows in detail the configuration of the signal output circuit 120 shown in FIG. 2 which outputs a differential signal according to the second embodiment of the present invention.

FIG. 4 shows in detail the configuration of the signal output circuit 120 shown in FIG. 2 which outputs a differential signal according to the second embodiment of the present invention. The second embodiment differs from the first embodiment in that one formatter element 20a and one differential output circuit element 38a are used in order for the signal output circuit 120 to output a differential signal. In FIG. 4, only two formatter elements 20a and 20b and one differential output circuit element 38a are shown. However, the formatter 20 may have three or more formatter elements, and the differential output circuit 30 may have multiple differential output circuit elements. Those components in FIG. 3 having the same reference codes and numerals are substantially equal to the corresponding components shown in FIG. 2. Such components will not be explained here.

The differential output circuit element 38a has drivers 92 and 94, a time delay circuit 96, a selection circuit 98, pin drivers 100 and 102, and switches 104a, 106a, 104b, and 106b. The output terminal of the driver 92 is connected to the "input port 0" of the selection circuit 98 and the input terminal of the time delay circuit 96. The output terminal of the driver 94 is connected to the "input port 1" of the selection circuit 98. The output terminal-of the time delay circuit 96 is connected to the input terminal of the pin driver 100. The output terminal of the selection circuit 98 is connected to the input terminal of the pin driver 102. The switch 104a is connected to the output terminal of the pin driver 100. The switch 104b is connected to the output terminal of the pin driver 102. The switches 106a and 106b are grounded.

The formatter element 20a is connected to the driver 92 via the cable 60a. The formatter element 20b is connected to the driver 94 via the cable 60b. These cables 60a and 60b are shown in the drawing as separate cables. However, they may be constructed as one cable.

The formatter element 20a receives the semiconductor device input signal 12a generated by the pattern generator 10. The formatter element 20b receives the semiconductor device input signal 12b generated by the pattern generator 10 independently of the formatter 20a. The formatter element 20a re-shapes the waveform of the semiconductor device input signal 12a in accordance with the characteristic of the test semiconductor device 42, and outputs a waveform re-shaped semiconductor device input signal 22a. Similarly, the formatter element 20b re-shapes the waveform of the semiconductor device input signal 12b in accordance with the characteristic of the test semiconductor device 42, and outputs a waveform re-shaped semiconductor device input signal 22b. The waveform re-shaped semiconductor device input signals 22a and 22b are input to the drivers 92 and 94 via the cables 60a and 60b, respectively.

The semiconductor device input signal 22a output from the driver 92 is input to the time delay circuit 96 and the input "port 0" of the selection circuit 98. The semiconductor device input signal 22b output from the driver 94 is input to the time delay circuit 96 and the input "port 1" of the selection circuit 98. The selection circuit 98 selects the inverted signal of the semiconductor device input signal 22a or the semiconductor device input signal 22b.

The time delay circuit 96 delays the transmission of the semiconductor device input signal 22a. Specifically, the time delay circuit 96 delays the transmission of the semiconductor device input signal 22a by the length of time substantially equal to the length of time required for the semiconductor device input signal 22a or the semiconductor device input signal 22b, which is input to the time delay circuit 96, to pass through the selection circuit 98. The semiconductor device input signal 22a, which has been delayed by the time delay circuit 96, is transmitted to the pin driver 100. The inverted signal of the semiconductor device input signal 22a or the semiconductor device input signal 22b selected by the selection circuit 98 is transmitted to the pin driver 102.

The pin driver 100 outputs the semiconductor device input signal 22a as a first signal 32e. The pin driver 102 outputs the inverted signal of the semiconductor device input signal 22a or the semiconductor device input signal 22b as a second signal 32f. The switches 104a, 106a, 104b, and 106b correspond to the switches 88a, 90a, 88b, and 90b in FIG. 3, respectively. When the switches 104a and 104b are closed and the switches 106a and 106b are open, the first signal 32e and the second signal 32f are output to the test semiconductor device 42.

When the selection circuit 98 selects the semiconductor device input signal 22b, the signal output circuit 120 outputs the semiconductor device input signal 22a as the first signal 32e and the semiconductor device input signal 22b as the second signal 32f, which are two independent signals. On the other hand, when the selection circuit 98 selects the inverted signal of the semiconductor device input signal 22a, the signal output circuit 120 outputs the semiconductor device input signal 22a as the first signal 32e and the second signal 32f as the inverted signal of the semiconductor device input signal 22a. The first signal 32e and the second signal 32f are output as differential signals to the semiconductor device 42. The skew generated between the differential signals that are output in this embodiment is not generated by any of the electric devices prior to the selection circuit 98. Hence, the skew generated between the differential signals 32e and 32f is significantly smaller than the skew between the differential signals 32a and 32b generated by the conventional configuration shown in FIG. 1.

The signal output circuit 120 in the second embodiment generates two independent signals. Moreover, compared with the structure shown in FIG. 1, the signal output circuit 120 in the second embodiment generates differential signals having a small skew. This signal output circuit 120 is able to use these functions selectively based on the type of the semiconductor device 42 to be tested. That is, if the semiconductor device 42 operates with a differential signal, the signal output circuit 120 outputs a differential signal. If the semiconductor device 42 does not require a differential input signal, the signal output circuit 120 outputs two independent signals. It is very important for a semiconductor device testing apparatus to have multi-purpose functions capable of testing semiconductor devices of many types.

Figure 5:
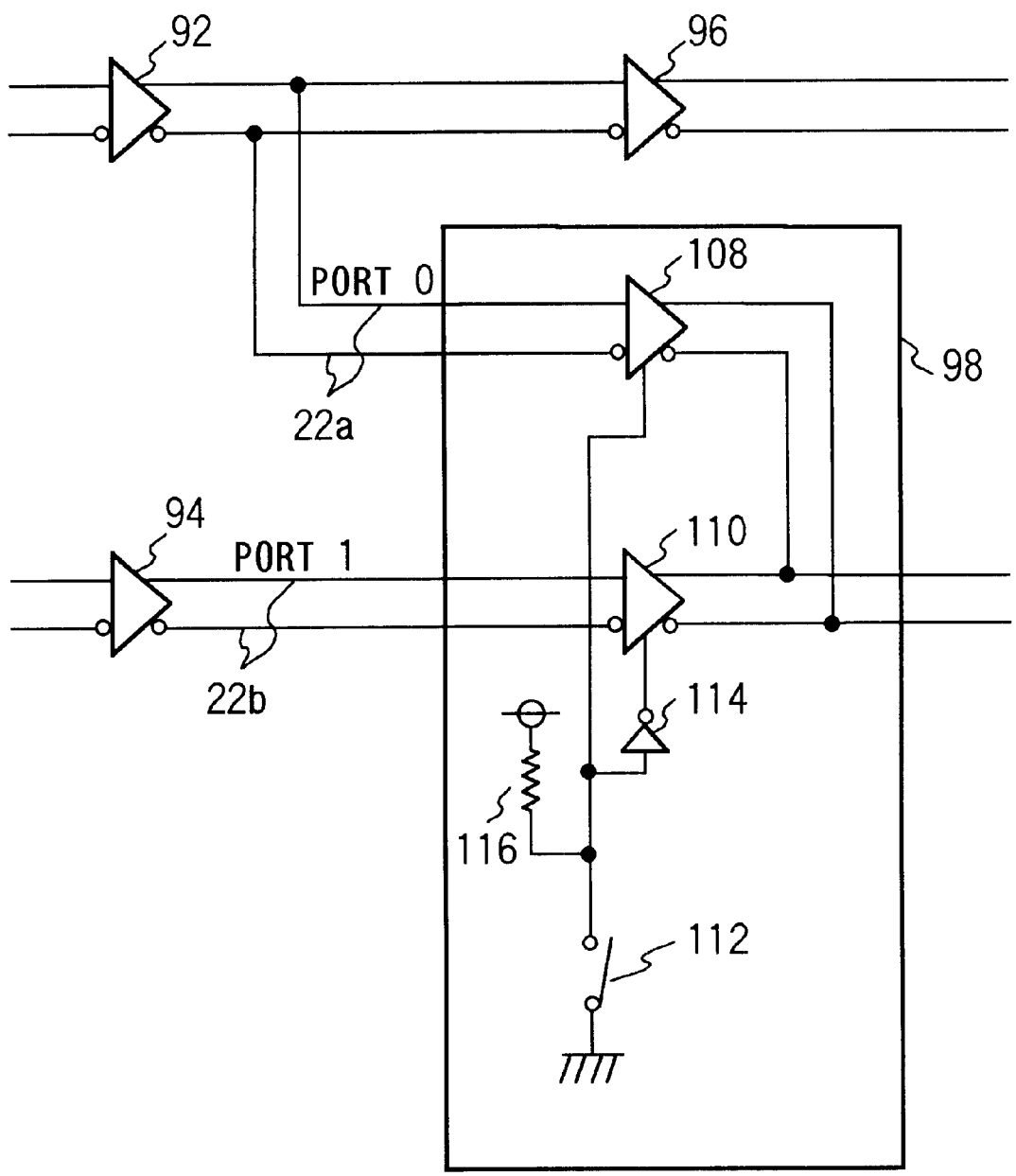
FIG. 5 shows in detail the selection circuit 98 shown in FIG. 4 and the peripheral circuit device of the selection circuit 98.

FIG. 5 shows the selection circuit 98 and an embodiment of a peripheral circuit device of the selection circuit 98. As described above, in the semiconductor device testing apparatus, most transmitted signals are differential signals, and differential signals are input to most of the circuit devices.

The selection circuit 98 has drivers 108 and 110, a switch 112, an inverter 114, and a resistor 116. The driver 108 is installed at the input "port 0", and inverts and outputs the semiconductor device input signal 22a. The driver 110 is installed at the input "port 1". Depending on whether the semiconductor device 42 to be tested has a differential signal, input pin set or not, the switch 112 selects the drive 108 or 110 before the semiconductor device input signal is input to the semiconductor device 42. Specifically, when the switch 112 is closed, the impedance of the driver 108 becomes high, turning on the driver 110. When the switch 112 is opened, the impedance of the driver 110 becomes high, turning on the driver 108.

The time delay circuit 96 delays the transmission of the semiconductor device input signal 22a by the length of time substantially equal to the length of time required for the semiconductor device input signal 22a to pass through the driver 108 and be inverted or for the semiconductor device input signal 22b to pass through the driver 110. As a result, the skew between the first signal 32e and the second signal 32f is made small.

According to the present invention, differential signals having a small skew can be generated. Moreover, according to the present invention, a highly general-purpose signal output circuit capable of selectively outputting two independent signals or differential signals is provided.

What is claimed is:

1. A signal output apparatus, comprising:
   a selection circuit which receives a first signal and a second signal and selects and outputs an inverted signal of said first signal or said second signal as an inverted first signal;
   a first driver for outputting said first signal;
   a second driver for outputting said inverted first signal or said second signal selected by said selection circuit; and
   an output signal detection unit for detecting a semiconductor device output signal generated by a semiconductor device based on the signals output from the first driver and second driver.

2. A signal output apparatus as claimed in claim 1, further comprising:
   a first formatter for generating said first signal; and
   a second formatter for generating said second signal.

3. A signal output apparatus as claimed in claim 2, wherein said first formatter re-shapes a waveform of said first signal in generating said first signal and said second formatter re-shapes a waveform of said second signal in generating said second signal.

4. A signal output apparatus as claimed in claim 2, further comprising a time delay circuit for delaying said first signal.

5. A signal output apparatus as claimed in claim 4, wherein said first formatter re-shapes a waveform of said first signal in generating said first signal and said second formatter re-shapes a waveform of said second signal in generating said second signal.

6. A signal output apparatus as claimed in claim 4, wherein said time delay circuit delays transmission of said first signal by a length of time substantially equal to a length of time said inverted first signal and said second signal require to pass through said selection circuit.

7. A signal output apparatus as claimed in claim 6, wherein said first formatter re-shapes a waveform of said first signal in generating said first signal and said second formatter re-shapes a waveform of said second signal in generating said second signal.

8. A semiconductor device testing apparatus for testing a semiconductor device, comprising:
   a pattern generator for generating a semiconductor device input signal for testing said semiconductor device;
   a signal output circuit which outputs said semiconductor device input signal generated by said pattern generator to said semiconductor device;
   a semiconductor device plug-in unit, to which said semiconductor device is plugged in, for supplying said semiconductor device signal output from said signal output circuit to said semiconductor device; and
   an output signal detection unit which detects an output signal that is generated based on said semiconductor device input signal supplied to said semiconductor device by said semiconductor device plug-in unit, wherein said signal output circuit has:
   a selection circuit which receives a first signal and a second signal and selects and outputs an inverted signal of said first signal or said second signal;
   a first driver for outputting said first signal; and
   a second driver for outputting said inverted signal of said first signal or said second signal selected by said selection circuit.

9. A semiconductor device testing apparatus as claimed in claim 8, wherein said signal output circuit further has:

a first formatter for generating said first signal; and a second formatter for generating said second signal.

10. A semiconductor device testing apparatus as claimed in claim 9, wherein said first formatter re-shapes a waveform of said first signal in generating said first signal and said second formatter re-shapes a waveform of said second signal in generating said second signal.

11. A semiconductor device testing apparatus as claimed in claim 9, wherein said signal output circuit further has a time delay circuit for delaying said first signal.

12. A semiconductor device testing apparatus as claimed in claim 11, wherein said first formatter re-shapes a waveform of said first signal in generating said first signal and said second formatter re-shapes a waveform of said second signal in generating said second signal.

13. A semiconductor device testing apparatus as claimed in claim 11, wherein said time delay circuit delays transmission of said first signal by a length of time substantially equal to a length of time said inverted first signal and said second signal require to pass through said selection circuit.

14. A semiconductor device testing apparatus as claimed in claim 13, wherein said first formatter re-shapes a waveform of said first signal in generating said first signal and said second formatter re-shapes a waveform of said second signal in generating said second signal.

* * * * *